United States Patent [19]
Beele

[11] Patent Number: 6,071,556
[45] Date of Patent: Jun. 6, 2000

[54] METHOD OF COATING AN ARTICLE OF MANUFACTURING HAVING A SUBSTRATE FORMED OF A NICKEL OR COBALT-BASED SUPERALLOY

[75] Inventor: Wolfram Beele, Ratingen, Germany

[73] Assignee: Siemens Aktiengesellschaft, Munich, Germany

[21] Appl. No.: 09/419,692

[22] Filed: Oct. 14, 1999

Related U.S. Application Data

[62] Division of application No. 08/958,260, Oct. 27, 1997, Pat. No. 5,985,467, which is a continuation of application No. PCT/EP96/01565, Apr. 12, 1996, which is a continuation of application No. 08/428,449, Apr. 25, 1995, abandoned, and a continuation of application No. 08/428,452, Apr. 25, 1995, abandoned.

[51] Int. Cl.[7] .................................................. C23C 14/08
[52] U.S. Cl. ..................................... 427/126.3; 427/126.4; 427/255.7; 427/377; 427/419.3
[58] Field of Search ............................... 427/126.3, 126.4, 427/567, 529, 580, 419.3, 255.7, 377, 248.1

[56] References Cited

U.S. PATENT DOCUMENTS

| 5,514,482 | 5/1996 | Strangman . |
| 5,763,107 | 6/1998 | Rickerby et al. . |

*Primary Examiner*—Roy V. King
*Attorney, Agent, or Firm*—Herbert L. Lerner; Laurence A. Greenberg; Werner H. Stemer

[57] ABSTRACT

A nickel-based or cobalt-based superalloy substrate is covered with a protective system which is resistant to thermal, corrosive and erosive attack. An anchoring layer is disposed on the substrate. The anchoring layer is formed as an oxide compound, in particular alumina, doped with nitrogen. A ceramic coating is disposed on the anchoring layer. The modification of the anchoring layer prevents the transmission of diffusing elements through the anchoring layer to the thermal barrier layer.

6 Claims, 1 Drawing Sheet

6,071,556

METHOD OF COATING AN ARTICLE OF MANUFACTURING HAVING A SUBSTRATE FORMED OF A NICKEL OR COBALT-BASED SUPERALLOY

CROSS-REFERENCE TO RELATED APPLICATION

This is a divisional application of U.S. application Ser. No. 08/958,260, filed Oct. 27, 1997, now U.S. Pat. No. 5,985,467 which was a continuation of international application No. PCT/EP96/01565, filed Apr. 12, 1996, which designated the United States, and which in turn is a continuation of U.S. application Ser. No. 08/428,449, filed Apr. 25, 1995 and now abandoned, and a continuation of U.S. application Ser. No. 08/428,452, filed Apr. 25, 1995 and now abandoned.

BACKGROUND OF THE INVENTION

1. Field of the Invention

The invention relates to a superalloy component which has applied thereon a protective coating system with various layers.

2. Description of the Related Art

U.S. Pat. No. 4,055,705 to Stecura et al.; U.S. Pat. No. 4,321,310 to Ulion et al.; and U.S. Pat. No. 4,321,311 to Strangman disclose coating systems for gas turbine components made from nickel or cobalt-based superalloys. A coating system described comprises a thermal barrier layer made from ceramic, which in particular has a columnar grained structure, placed on a bonding layer or bond coating which in its turn is placed on the substrate and bonds the thermal barrier layer to the substrate. The bonding layer is made from an alloy of the MCrAlY type, namely an alloy containing chromium, aluminum and a rare earth metal such as yttrium in a base comprising at least one of iron, cobalt and nickel. Further elements can also be present in an MCrAlY alloy; examples are given below. An important feature of the bonding layer is a thin layer developed on the MCrAlY alloy and used for anchoring the thermal barrier layer. This layer may be alumina or alumina mixed with chromium oxide, depending on the composition of the MCrAlY alloy and the temperature of the oxidizing environment where the layer is developed. Eventually, an alumina layer may be placed purposefully by a separate coating process like PVD.

U.S. Pat. No. 5,238,752 to Duderstadt et al. discloses a coating system for a gas turbine component which also incorporates a ceramic thermal barrier layer and a bonding layer or bond coating bonding the thermal barrier layer to the substrate. The bonding layer is made from an intermetallic aluminide compound, in particular a nickel aluminide or a platinum aluminide. The bonding layer also has a thin alumina layer which serves to anchor the thermal barrier layer.

U.S. Pat. No. 5,262,245 to Ulion et al. describes a result of an effort to simplify coating systems incorporating thermal barrier layers for gas turbine components by avoiding a bonding layer to be placed below the thermal barrier layer. To this end, a composition for a superalloy is disclosed which may be used to form a substrate of a gas turbine component and which develops an alumina layer on its outer surfaces under a suitable treatment. That alumina layer is used to anchor a ceramic thermal barrier layer directly on the substrate, eliminating the need for a special bonding layer to be interposed between the substrate and the thermal barrier layer. In its broadest scope, the superalloy consists essentially of, as specified in weight percent: 3 to 12 Cr, 3 to 10 W, 6 to 12 Ta 4 to 7 Al, 0 to 15 Co, 0 to 3 Mo, 0 to 15 Re, 0 to 0.0020 B, 0 to 0.045 C, 0 to 0.8 Hf, 0 to 2 Nb, 0 to 1 V, 0 to 0.01 Zr, 0 to 0.07 Ti, 0 to 10 of the noble metals, 0 to 0.1 of the rare earth metals including Sc and Y, balance Ni.

U.S. Pat. No. 5,087,477 to Giggins, Jr., et al. shows a method for placing a ceramic thermal barrier layer on a gas turbine component by a physical vapor deposition process comprising evaporating compounds forming the thermal barrier layer with an electron beam and establishing an atmosphere having a controlled content of oxygen at the component to receive the thermal barrier layer.

U.S. Pat. Nos. 5,154,885; 5,268,238; 5,273,712; and 5,401,307, all to Czech et al. disclose advanced coating systems for gas turbine components comprising protective coatings of MCrAlY alloys. The MCrAlY alloys disclosed have carefully balanced compositions to give exceptionally good resistance to corrosion and oxidation as well as an exceptionally good compatibility to the superalloys used for the substrates. The basis of the MCrAlY alloys is formed by nickel and/or cobalt. Additions of further elements, in particular silicon and rhenium, are also discussed. Rhenium in particular is shown to be a very advantageous additive. All MCrAlY alloys shown are also very suitable as bonding layers for anchoring thermal barrier layers, particularly in the context of the invention which will be described in the following.

The above-mentioned U.S. Pat. No. 5,401,307 to Czech et al. also contains a survey over superalloys which are considered useful for forming gas turbine components that are subject to high mechanical and thermal loads during operation. Particularly, four classes of superalloys are given. The respective superalloys consist essentially of, as specified in percent by weight:

1. 0.03 to 0.05 C, 18 to 19 Cr, 12 to 15 Co, 3 to 6 Mo, 1 to 1.5 W, 2 to 2.5 Al, 3 to 5 Ti, optional minor additions of Ta, Nb, B and/or Zr, balance Ni.
2. 0.1 to 0.15 C, 18 to 22 Cr, 18 to 19 Co, 0 to 2 W, 0 to 4 Mo, 0 to 1.5 Ta, 0 to 1 Nb, 1 to 3 Al, 2 to 4 Ti, 0 to 0.75 Hf, optional minor additions of B and/or Zr, balance Ni.
3. 0.07 to 0.1 C, 12 to 16 Cr, 8 to 10 Co, 1.5 to 2 Mo, 2.5 to 4 W, 1.5 to 5 Ta, 0 to 1 Nb, 3 to 4 Al, 3.5 to 5 Ti, 0 to 0.1 Zr, 0 to 1 Hf, an optional minor addition of B, balance Ni.
4. about 0.25 C, 24 to 30 Cr, 10 to 11 Ni, 7 to 8 W, 0 to 4
5. Ta, 0 to 0.3 Al, 0 to 0.3 Ti, 0 to 0.6 Zr, an optional minor additive of B, balance cobalt.

Information on modified alumina compounds, in particular alumina compounds doped with nitrogen, is available from an essay by the inventor entitled "Schichtentwicklungen für Hochtemperaturanwendungen in thermischen Maschinen" [coating developments for high temperature applications in thermic machines] and published under "Fortschritts-Berichte VDI, Reihe 5" [progress reports by VDI, series no. 5], ser. No. 345, VDI-Verlag, Dusseldorf, Germany, 1994. That essay also contains information about processes to deposit such alumina compounds in the form of layers.

Further information on modified alumina compounds may be derived from an essay by L. Peichl and D. Bettridge entitled "Overlay and Diffusion Coatings for Aero Gas Turbines" and contained in a book entitled "Materials for Advanced Power Engineering, Part One", edited by D.

Coutsouradis et al., Kluwer Academic Publishers, Dordrecht, Netherlands, 1994, pages 717–740, and from an essay by O. Knotek, E. Lugscheider, F. Löffler and W. Beele, published in: Surface and Coating Techniques, Vol. 68/69 (1994), pages 22 to 26.

A standard practice in placing a thermal barrier coating on a substrate of an article of manufacture includes developing an oxide layer on the article, either by placing a suitable bonding layer on the article which develops the oxide layer on its surface under oxidizing conditions or by selecting a material for the article which is itself capable of developing an oxide layer on its surface. That oxide layer is then used to anchor the thermal barrier layer placed on it subsequently.

Under thermal load, diffusion processes will occur within the article. In particular, diffusion active chemical elements like hafnium, titanium, tungsten and silicon which form constituents of most superalloys used for the articles considered may migrate through the oxide layer and into the thermal barrier layer. The diffusion active chemical elements cause damage to the thermal barrier layer by modifying and eventually worsening its essential properties. That applies in particular to a thermal barrier layer made from a zirconia compound like partly stabilized zirconia, since almost all zirconia compounds must rely on certain ingredients to define and stabilize their particular properties. The action of such ingredients is likely to be imparted by chemical elements migrating into a compound, be it by diffusion or otherwise.

To assure that a thermal barrier layer placed on a substrate containing diffusion active chemical elements keeps its essential properties over a time period as long as may be desired, it is therefore material to prevent migration of diffusion active chemical elements into the thermal barrier layer.

That aspect has, however, not yet received attention in this art. Heretofore, only oxide layers have been given consideration to anchor a thermal barrier layer on a superalloy substrate regardless of their transmission of diffusing chemical elements to the thermal barrier layer.

SUMMARY OF THE INVENTION

It is accordingly an object of the invention to provide a superalloy component with a protective coating system, which overcomes the above-mentioned disadvantages of the heretofore-known devices of this general type and which keeps to a minimum or prevents the transmission of diffusing elements through an anchoring layer to a thermal barrier layer by modifying the anchoring layer suitably.

With the foregoing and other objects in view there is provided, in accordance with the invention, an article of manufacture, comprising: a substrate formed of a nickel or cobalt-based superalloy; an anchoring layer disposed on the substrate, the anchoring layer comprising an oxide compound doped with nitrogen; and a ceramic coating disposed on the anchoring layer.

In accordance with a preferred feature of the invention, the oxide compound comprises alumina and/or chromium oxide. Particularly, the oxide compound consists essentially of alumina.

In accordance with an added feature of the invention, the article includes a diffusion active chemical element covered by the anchoring layer. The diffusion active chemical element is preferably an element selected from the group consisting of hafnium, titanium, tungsten and silicon. In particular, the diffusion active element is contained in the substrate or a bonding layer disposed thereon.

In accordance with another feature of the invention, the ceramic coating includes $ZrO_2$. In a further development, the ceramic coating consists essentially of $ZrO_2$ and a stabilizer selected from the group consisting of $Y_2O_3$, $CeO_2$, LaO and MgO.

In a preferable embodiment, the anchoring layer has a thickness of less than 3 $\mu$m.

In accordance with a further feature of the invention, the anchoring layer contains from 1 to 10 atom percent of nitrogen, and preferably from 2 to 5 atom percent.

In accordance with again an added feature of the invention, the anchoring layer is also doped with a further chemical element, the further chemical element being also covered by the anchoring layer. In one embodiment of the invention, the further chemical element is chromium. In particular, the further chemical element is contained in the substrate or a bonding layer disposed thereon.

In accordance with again an additional feature of the invention, the anchoring layer is doped with a further chemical element, and the further chemical element is also present in the ceramic coating.

In accordance with again a further feature of the invention, the article is provided with a bonding layer interposed between the substrate and the anchoring layer.

In preferred embodiments, the bonding layer is formed of a metal aluminide, or it is formed of an MCrAlY alloy.

In accordance with yet another feature of the invention, the anchoring layer is doped with a further chemical element, and the further element is also present in the bonding layer.

In accordance with yet an added feature of the invention, the substrate, the bonding layer (if present), the anchoring layer and the ceramic coating form a gas turbine component. In particular, the gas turbine component is a gas turbine airfoil component comprising a mounting portion and an airfoil portion, the mounting portion being adapted to fixedly hold the component in operation and the airfoil portion being adapted to be exposed to a gas stream streaming along the component in operation, the anchoring layer and the ceramic layer being disposed on the airfoil portion.

With the above-mentioned and other objects in view, there is also provided, in accordance with the invention, a method of applying a ceramic coating to an article of manufacture having a substrate formed of a nickel or cobalt-based superalloy. Particularly, the substrate may have a bonding layer placed thereon, as described above. The method comprises the following steps:

placing an anchoring layer comprising an oxide compound doped with nitrogen on a substrate formed of a nickel or cobalt-based superalloy; and placing a ceramic coating on the anchoring layer.

In accordance with an additional mode of the invention, the step of placing the anchoring layer is performed by a physical vapor deposition process. Preferably, a physical vapor deposition process including sputtering or electron beam evaporation is used.

In accordance with another mode of the invention, the step of placing the anchoring layer comprises:

placing a layer comprising an other oxide compound essentially free of nitrogen on the substrate;

establishing an atmosphere containing nitrogen around the layer; and creating the anchoring layer by subjecting the layer and the atmosphere to an elevated temperature and diffusing the nitrogen into the layer.

The ceramic coating may also be placed onto the system by physical vapor deposition (PVD) process.

Other features which are considered as characteristic for the invention are set forth in the appended claims.

Although the invention is illustrated and described herein as embodied in a superalloy component with a protective coating system, it is nevertheless not intended to be limited to the details shown, since various modifications and structural changes may be made therein without departing from the spirit of the invention and within the scope and range of equivalents of the claims.

The construction of the invention, however, together with additional objects and advantages thereof will be best understood from the following description of the specific embodiments when read in connection with the accompanying drawings.

DESCRIPTION OF THE PREFERRED EMBODIMENTS

Figure 1:
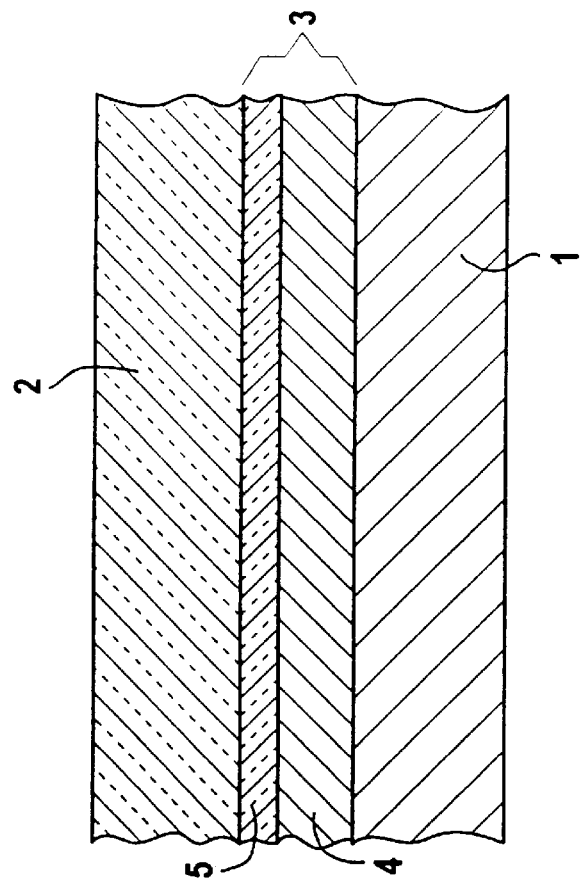
FIG. 1 is a fragmentary cross-sectional view of a substrate having a protective coating system incorporating a ceramic coating placed thereon.

Referring now to the figures of the drawing in detail and first, particularly, to FIG. 1 thereof, there is seen a substrate 1 of an article of manufacture, in particular a gas turbine component, which in operation is subject to heavy thermal load and concurrently to corrosive and erosive attack. The substrate 1 is formed of a material which is suitable to provide strength and structural stability when subjected to a heavy thermal load and eventually an additional mechanical load by severe forces like centrifugal forces. A material which is widely recognized and employed for such a purpose in a gas turbine engine is a nickel or cobalt-based superalloy.

In order to limit the thermal load imposed on the substrate 1, a thermal barrier layer 2 is placed thereon. The thermal barrier layer 2 is made from a columnar grained ceramic, in particular consisting essentially of a stabilized or partly stabilized zirconia, as explained above. The thermal barrier layer 2 is anchored to the substrate 1 by means of an intermediate layer 3. The intermediate layer 3 is made by placing a bonding layer 4 on the substrate 1, which bonding layer 4 consists of an MCrAlY alloy and preferably of an MCrAlY alloy as disclosed in one of U.S. Pat. Nos. 5,154,885; 5,268,238; 5,273,712; and 5,401,307, and developing an anchoring layer 5 on the bonding layer 4, as explained subsequently. The bonding layer 4 has certain functions in common with a bonding layer as known from the state of the art and in particular has a tight bond to the substrate 1. The anchoring layer 5 serves as an anchor for the thermal barrier layer 2. Both the bonding layer 4 and the anchoring layer 5 form the intermediate layer 3.

The drawing is not intended to show the thicknesses of the layers 4 and 5 to scale; the thickness of the anchoring layer 5 might in reality be very much less than the thickness of the bonding layer 4 and amount only to a few atomic layers, as specified hereinabove.

The anchoring layer 5 essentially consists of an oxide compound, namely alumina, doped with nitrogen. The nitrogen content need not be very high, and a nitrogen content of a few atom percent is considered to be effective.

The effect of the nitrogen doping in the anchoring layer 5 relies on the fact that the nitrogen atoms distributed in the oxide crystals, which are ion crystals made from positively charged metal ions and $O^{2-}$ ions, introduce imbalances into the distribution of electric charges in the ion crystal and thus hinder diffusion of atoms through the ion crystal. It can be said that an addition of a minor quantity of atoms effectively different from the atoms or related ions making up the crystal introduces irregularities into the crystal and renders it opaque or impenetrable for diffusing atoms, which no longer experience a regular pattern of constituents essential for easy penetration through a crystal. An addition of nitrogen in a considerably large amount and far beyond any addition which might be considered to be a doping could of course give rise to a complete restructuring of an oxide crystal into a crystal consisting of a regular pattern of metal, oxygen and nitrogen constituents.

The anchoring layer 5 can be made by several methods, in particular by a physical vapor deposition process like electron beam PVD, sputter ion plating and cathodic arc-PVD, or by thermal treatment of an oxide compound layer in a nitrogen-containing atmosphere. Such thermal treatment is in particular carried out at a temperature within a range between 700° C. and 1100° C. A nitrogen-containing atmosphere may also serve to provide the nitrogen for a PVD-process, which comprises evaporating the required metal and oxygen compound from a suitable source and adding the nitrogen from the atmosphere. Particularly, the nitrogen-containing atmosphere essentially consists of argon, oxygen and nitrogen, at a total pressure between $10^{-2}$ Pa and 1 Pa.

Figure 2:
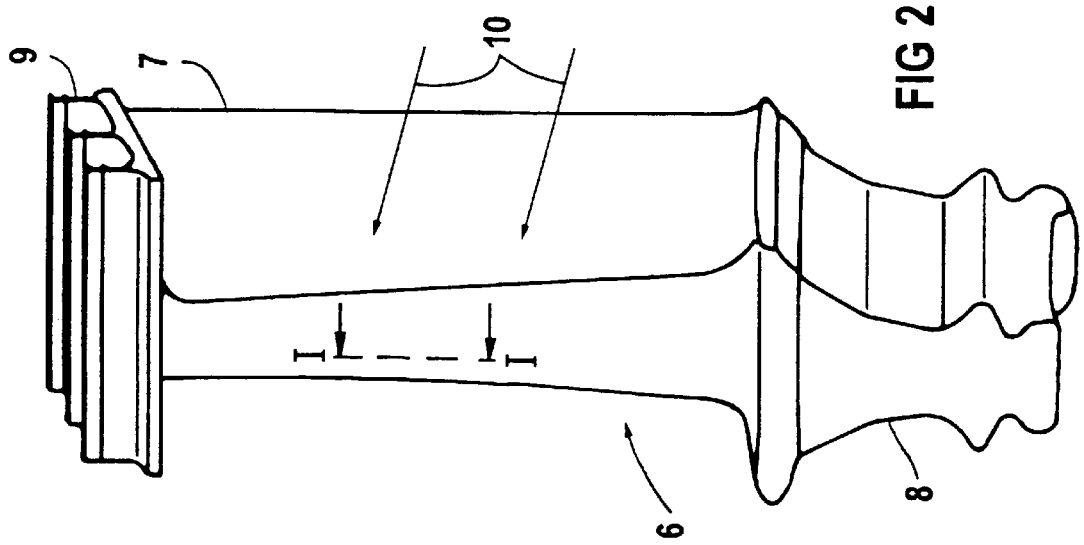
FIG. 2 is a perspective view of a gas turbine airfoil component comprising the substrate and protective coating system shown in FIG. 1.

FIG. 2 shows the complete gas turbine component, namely a gas turbine airfoil component 6, in particular a turbine blade. The component 6 has an airfoil portion 7, which in operation forms an "active part" of the gas turbine engine, a mounting portion 8, at which the component 6 is fixedly held in its place, and a sealing portion 9, which forms a seal together with adjacent sealing portions of neighboring components to prevent an escape of a gas stream 10 flowing along the airfoil portion 7 during operation.

The section of FIG. 1 is taken along the line I—I in FIG. 2.

Referring again to FIG. 1, particular advantages of the novel combination of the anchoring layer 5 and the thermal barrier layer 2 can be summarized as follows: As the anchoring layer 5 has a high content of compounds made up of metal and oxygen, whereof an exact chemical formula can hardly been given due to the distorting action of the nitrogen also present, it is indeed very suitable for anchoring a thermal barrier layer 2. That thermal barrier layer 2 may expediently be deposited on the substrate 1 immediately after deposition of the anchoring layer 5 and in particular within the same apparatus and by using as much as possible installations which have been already in use for depositing the anchoring layer 5. The combination of the anchoring layer 5 and the thermal barrier layer 2 thus made has all the advantages of such combinations known from the prior art and additionally features a substantially prolonged lifetime due to the suppression of migration of diffusion active elements into the thermal barrier layer 2.

I claim:

1. A method of coating an article of manufacture having a substrate formed of a nickel or cobalt-based superalloy, the method which comprises:

forming an intermediate layer on the substrate of the nickel or cobalt-based superalloy, the intermediate layer comprising an anchoring layer formed of an oxide compound doped with nitrogen; and placing a ceramic coating on the intermediate layer.

2. The method according to claim 1, wherein the forming step comprises interposing a bonding layer between the substrate and the anchoring layer.

3. The method according to claim 1, wherein the step of forming the anchoring layer is performed by a physical vapor deposition process.

4. The method according to claim 1, wherein the step of forming the anchoring layer comprises:

placing a layer comprising an oxide compound which is substantially free of nitrogen on the substrate; establishing an atmosphere containing nitrogen around the layer; and subjecting the layer and the atmosphere to elevated temperature and diffusing the nitrogen into the layer.

5. The method according to claim 1, wherein the step of forming the anchoring layer comprises:

placing a layer comprising an oxide compound which is substantially free of nitrogen onto the bonding layer;

establishing an atmosphere containing nitrogen around the layer; and subjecting the layer and the atmosphere to elevated temperature and diffusing the nitrogen into the layer.

6. The method according to claim 1, wherein the step of placing the ceramic coating comprises depositing ceramic on the anchoring layer by physical vapor deposition.

* * * * *